United States Patent
Seo et al.

(10) Patent No.: US 12,143,740 B2
(45) Date of Patent: Nov. 12, 2024

(54) AMPLIFIER, ANALOG-TO-DIGITAL CONVERTER INCLUDING THE SAME, IMAGE SENSING DEVICE, AND SIGNAL PROCESSING METHOD THEREOF

(71) Applicant: Samsung Electronics Co., Ltd., Suwon-si (KR)

(72) Inventors: Minwoong Seo, Suwon-si (KR); Hyunyong Jung, Suwon-si (KR); Myunglae Chu, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 63 days.

(21) Appl. No.: 17/989,764

(22) Filed: Nov. 18, 2022

(65) Prior Publication Data

US 2023/0156363 A1 May 18, 2023

(30) Foreign Application Priority Data

Nov. 18, 2021 (KR) .................. 10-2021-0159787
May 20, 2022 (KR) .................. 10-2022-0062305

(51) Int. Cl.
*H04N 25/75* (2023.01)
*H03M 1/12* (2006.01)
*H04N 25/671* (2023.01)
*H04N 25/77* (2023.01)

(52) U.S. Cl.
CPC ............ *H04N 25/75* (2023.01); *H04N 25/77* (2023.01); *H03M 1/12* (2013.01); *H04N 25/671* (2023.01)

(58) Field of Classification Search
CPC ...... H04N 25/75; H04N 25/77; H04N 25/671; H04N 25/78; H04N 25/616; H03M 1/12; H03M 1/123; H03M 1/56
See application file for complete search history.

(56) References Cited

U.S. PATENT DOCUMENTS

| | | | |
|---|---|---|---|
| 7,554,478 B2 | 6/2009 | Lim | |
| 7,924,207 B2 | 4/2011 | Snoeij et al. | |
| 9,967,496 B2 | 5/2018 | Ayers et al. | |
| 10,075,155 B2* | 9/2018 | Kikuchi | H04N 25/745 |
| 10,154,223 B2* | 12/2018 | Ogawa | H03K 5/2472 |
| 2010/0091167 A1* | 4/2010 | Azami | H04N 25/75 |
| | | | 348/340 |

(Continued)

FOREIGN PATENT DOCUMENTS

KR            101990297 B1      6/2019

*Primary Examiner* — Nhan T Tran
(74) *Attorney, Agent, or Firm* — Muir Patent Law, PLLC

(57) ABSTRACT

An image sensing device including a pixel array including a plurality of pixels and an analog-to-digital converter (ADC) configured to convert an analog signal into a digital signal is provided. The ADC includes a first circuit configured to receive the analog signal from a selected pixel among the plurality of pixels and generate a first output signal and a second circuit including a select transistor configured to apply a voltage to a floating node electrically connected to the select transistor based on the first output signal. The second circuit further includes a capacitor connected in parallel between a gate and a drain of the select transistor and an output circuit connected to the floating node and configured to output the digital signal based on the applied voltage to the floating node.

20 Claims, 18 Drawing Sheets

(56) References Cited

U.S. PATENT DOCUMENTS

| | | |
|---|---|---|
| 2017/0262337 A1 | 9/2017 | Chang et al. |
| 2020/0186734 A1* | 6/2020 | Nagawa .............. H03M 1/0845 |
| 2021/0193568 A1 | 6/2021 | Jung et al. |

* cited by examiner

AMPLIFIER, ANALOG-TO-DIGITAL CONVERTER INCLUDING THE SAME, IMAGE SENSING DEVICE, AND SIGNAL PROCESSING METHOD THEREOF

CROSS-REFERENCE TO RELATED APPLICATIONS

This application is based on and claims priority under 35 U.S.C. § 119 to Korean Patent Application Nos. 10-2021-0159787, filed on Nov. 18, 2021 and 10-2022-0062305, filed on May 20, 2022, in the Korean Intellectual Property Office, the disclosure of each of which is incorporated by reference herein in its entirety.

BACKGROUND

The inventive concept relates to an image sensor, and more particularly, to an amplifier for an image sensor, an analog-to-digital converter (ADC) including the amplifier, an image sensing device, and a signal processing method thereof.

Image sensors capture a two-dimensional (2D) or three-dimensional (3D) image of an object. Image sensors generate an image of an object using a photoelectric conversion element, which reacts to the intensity of light reflected from the object. With the recent development of complementary metal-oxide semiconductor (CMOS) technology, CMOS image sensors (CISs) using CMOS have been widely used. In CMOS image sensors, correlated double sampling (CDS) is used to remove pixel reset noise. To increase the quality of images, the high performance of an analog-to-digital conversion circuit using CDS is desired.

SUMMARY

The inventive concept provides an amplifier for increasing the quality of an image signal by decreasing noise and increasing an input range, an analog-to-digital converter (ADC) including the same, and an image sensor.

According to an aspect of the inventive concept, there is provided an image sensing device including a pixel array and an ADC. The pixel array may include a plurality of pixels. The ADC may be configured to convert an analog signal into a digital signal. The ADC may include a first circuit configured to receive the analog signal from a selected pixel among the plurality of pixels and generate a first output signal and a second circuit including a select transistor configured to apply a voltage to a floating node electrically connected to the select transistor based on the first output signal. The second circuit may further include a capacitor connected in parallel between an input (e.g., a gate) and an output (e.g., a drain) of the select transistor and an output circuit connected to the floating node and configured to output the digital signal based on the applied voltage to the floating node.

According to another aspect of the inventive concept, there is provided an ADC including a first circuit configured to receive an analog signal from a plurality of pixels of an image sensing device and generate a first output signal and a second circuit including a select transistor configured to apply a voltage to a floating node electrically connected to the select transistor based on the first output signal. The second circuit may further include a capacitor connected in parallel between an input (e.g., a gate) and an output (e.g., a drain) of the select transistor and an output circuit connected to the floating node and configured to output a second output signal based on the applied voltage to the floating node.

According to a further aspect of the inventive concept, there is provided a signal processing method of an image sensing device including an ADC configured to convert an analog signal input from a plurality of pixels into a digital signal. The signal processing method includes inputting a first signal from the plurality of pixels of the image sensing device to a first input terminal of a first circuit, inputting a second signal from a ramp signal generator to a second input terminal of the first circuit, comparing the first signal of the first input terminal with the second signal of the second input terminal and performing a decision operation based on a comparison result, outputting a first output signal to a select transistor based on a comparison result, applying a voltage to a floating node through the select transistor based on the first output signal, and outputting a second output signal from an output circuit by receiving the voltage applied to the floating node during the decision operation. The outputting of the first output signal may include limiting a bandwidth of the first output signal during the decision operation.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
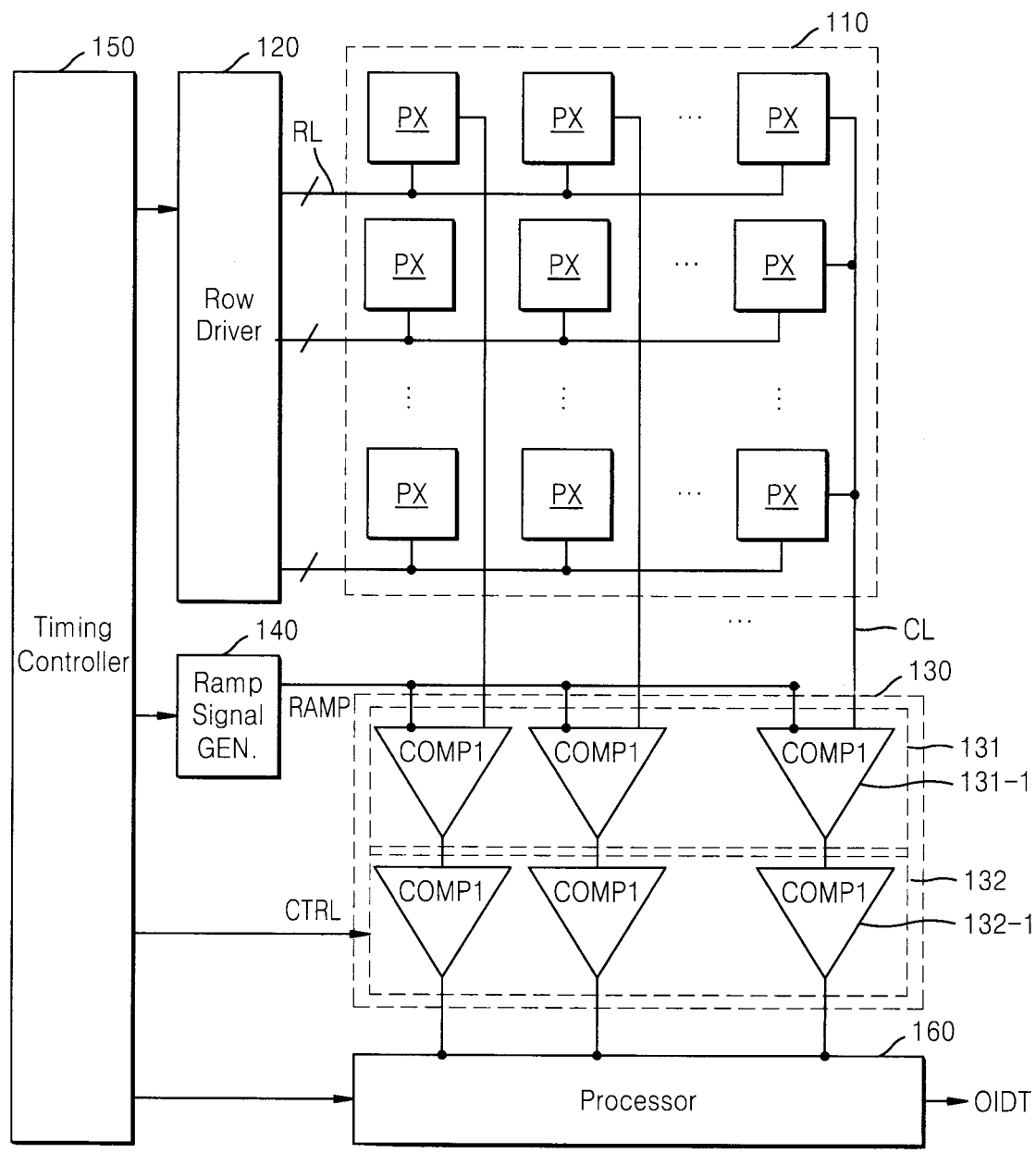
FIG. 1 is a block diagram of an image sensor according to an embodiment.

Before embodiments are described in detail, the terms used herein are described briefly.

With respect to the terms used in embodiments, general terms which are currently and widely used are selected in consideration of functions of structural elements in the embodiments. However, meanings of the terms can be changed according to intention, a judicial precedence, the appearance of new technology, and the like. In addition, in certain cases, a term which is not commonly used can be selected. In such a case, the meaning of the term will be described in detail at the corresponding portion in the description. Therefore, the terms used in the embodiments should be defined based on the meanings of the terms and the descriptions provided herein.

While terms including ordinal numbers such as "first," "second," etc., may be used to describe various components, such components must not be limited to the above terms. The terms are used only to distinguish one component from another. For example, a first component could be termed a second component, and, similarly, a second component could be termed a first component without departing from the scope of the embodiments. The term "and/or" includes combinations of a plurality of associated listed items or one of the associated listed items.

Embodiments will be described in detail hereinafter with reference to the accompanying drawings so as to be easily implemented by one of ordinary skill in the art to which the embodiments belongs. Embodiments may, however, be embodied in many different forms and is not limited to the embodiments set forth herein. Portions irrelevant to descriptions will be omitted from the drawings for clarity. In the drawings, like numerals refer to like elements throughout.

FIG. 1 is a block diagram of an image sensor according to an embodiment.

Referring to FIG. 1, an image sensor 100 may be mounted on an electronic device, which has a function of sensing an image or light. For example, the image sensor 100 may be mounted on an electronic device, such as a camera, a smartphone, a wearable device, an Internet of things (IoT) device, a table personal computer (PC), a personal digital assistant (PDA), a portable multimedia player (PMP), or a navigation device. The image sensor 100 may also be mounted on electronic devices that are used as components of vehicles, furniture, manufacturing facilities, doors, or various kinds of measuring equipment.

The image sensor 100 may include a pixel array 110, a row driver 120, an analog-to-digital converter (ADC) 130, a ramp signal generator 140, a timing controller 150, and a processor 160.

The pixel array 110 may include a plurality of pixels PX, which are connected to a plurality of row lines RL and a plurality of column lines CL and arranged in a matrix. Herein, for convenience of description, the terms of a plurality of pixels PX and a pixel PX may be used interchangeably. Each of the pixels PX may include a photosensitive device. For example, the photosensitive device may include a photodiode, a phototransistor, a photogate, a pinned photodiode, or the like. Each of the pixels PX may include at least one photosensitive device. In an embodiment, each of the pixels PX may include a plurality of photosensitive devices. The photosensitive devices may be stacked on each other.

The pixels PX may sense light using a photosensitive device and convert the light into a pixel signal corresponding to an electrical signal. Each of the pixels PX may sense light in a particular spectrum. For example, the pixels PX may include a red pixel converting light in a red spectrum into an electrical signal, a green pixel converting light in a green spectrum into an electrical signal, and a blue pixel converting light in a blue spectrum into an electrical signal. A color filter transmitting light in a particular spectrum may be provided above each of the pixels PX.

The row driver 120 may drive the pixel array 110 row-by-row. The row driver 120 may decode a row control signal (e.g., an address signal) generated by the timing controller 150 and select at least one of the row lines RL of the pixel array 110 in response to a decoded row control signal. For example, the row driver 120 may generate a row select signal. The pixel array 110 may output a pixel signal from a row, which is selected by the row select signal from the row driver 120. The pixel signal may include a reset signal and an image signal.

The ADC 130 may convert an analog pixel signal, which is input from the pixel array 110, into a digital signal. The ADC 130 may include a first comparison block 131 and a second comparison block 132.

The first comparison block 131 may include a plurality of first circuits 131-1. Herein, for convenience of description, the terms of a plurality of first circuits 131-1 and a first circuit 131-1 may be used interchangeably. Each of the first circuits 131-1 may compare a ramp signal RAMP with a pixel signal, which is output from a pixel connected to one of the column lines CL of the pixel array 110. The second comparison block 132 may include a plurality of second circuits 132-1. Herein, for convenience of description, the terms of a plurality of second circuits 132-1 and a second circuit 132-1 may be used interchangeably. Each of the second circuits 132-1 may generate an output signal. The first comparison block 131 may include the plurality of first circuits 131-1 respectively corresponding to columns. Each of the first circuits 131-1 may be connected to the pixel array 110 and a corresponding one of the second circuits 132-1.

Each of the first circuits 131-1 may receive a pixel signal and the ramp signal RAMP, which is generated from the ramp signal generator 140, compare the pixel signal with the ramp signal RAMP, and output a comparison result signal through an output terminal thereof.

Each of the first circuits 131-1 may generate a comparison result signal obtained by using correlated double sampling (CDS) and may be referred to as a CDS circuit. A plurality of pixel signals respectively output from the pixels PX may have a variation due to intrinsic characteristics (e.g., fixed pattern noise FPN)) of the pixels PX and/or a variation due to a difference between characteristics of logics each outputting a pixel signal from a pixel PX. To compensate for a variation in the pixel signals, a process of obtaining a reset component (or a reset signal) and an image component (or an image signal) for each pixel signal and extracting a difference between the reset component and the image component as a valid signal component is performed. This process is called CDS. Each of the first circuits 131-1 may output a comparison result signal obtained by using CDS.

According to an embodiment, the ADC 130 may include a first circuit 131-1 and a second circuit 132-1. The second circuit 132-1 may amplify an output of the first circuit 131-1 and output an amplified result. In an embodiment, the first circuit 131-1 may operate based on less bias current in an auto-zero (AZ) phase than in a comparison phase. Accordingly, with the reduction of noise, an input range may be increased. In an embodiment, the first circuit 131-1 may include a limiter circuit connecting an output terminal to a common node. The limiter circuit may prevent the voltage level of the common node from decreasing below a minimum value and compensate for a voltage change in an output node. In an embodiment, the second circuit 132-1 may adaptively control current sources, which generate bias current, in each operation phase, and generate minimum bias current before and after decision. Accordingly, a change in electric power may be prevented from occurring when the second circuit 132-1 operates.

According to an embodiment, the second comparison block 132 may include a plurality of second circuits 132-1. Each of the second circuits 132-1 may operate as a counter. For example, each of the second circuits 132-1 may receive an output signal from one of the first circuits 131-1 corresponding to the second circuit 132-1 and perform a count based on the output signal. A counter control signal CTRL may include a counter clock signal, a counter reset signal for controlling the reset operation of the second circuits 132-1, an inverting signal for inverting an internal bit of each of the second circuits 132-1, and the like. The second comparison block 132 may count a comparison result signal according to the counter clock signal and output a digital signal as a counting result.

The second comparison block 132 may include an up/down counter, a bitwise inversion counter, and the like. The bitwise inversion counter may perform similar operations to the up/down counter. For example, the bitwise inversion counter may perform a function performed only by the up/down counter and a function of generating 1's complement by inverting all internal bits thereof when receiving a particular signal. The bitwise inversion counter may perform a reset count and then convert a result of the reset count into 1's complement, i.e., a negative value, by inverting the result of the reset count.

The ramp signal generator 140 may generate the ramp signal RAMP. The ramp signal generator 140 may operate based on a ramp control signal from the timing controller 150. The ramp control signal may include a ramp enable signal, a mode signal, and the like. When the ramp enable signal is activated, the ramp signal generator 140 may generate the ramp signal RAMP with a slope set based on the mode signal.

The timing controller 150 may output a control signal or a clock signal to each of the row driver 120, the ADC 130, and the ramp signal generator 140 to control the operation or timing of each of the row driver 120, the ADC 130, and the ramp signal generator 140.

The processor 160 may process data of pixel values input from the ADC 130. The processor 160 may perform image quality compensation, binning, downsizing, or the like on image data. Accordingly, output image data OIDT resulting from image processing may be generated and output in certain units.

For example, the processor 160 may process image data by colors. For example, when image data includes red, green, and blue pixel values, the processor 160 may process the red, green, and blue pixel values in parallel or in series. The processor 160 may process image data by colors in parallel and include a plurality of processing circuits.

The processor 160 may generate the output image data OIDT resulting from processing input image data.

Figure 2:
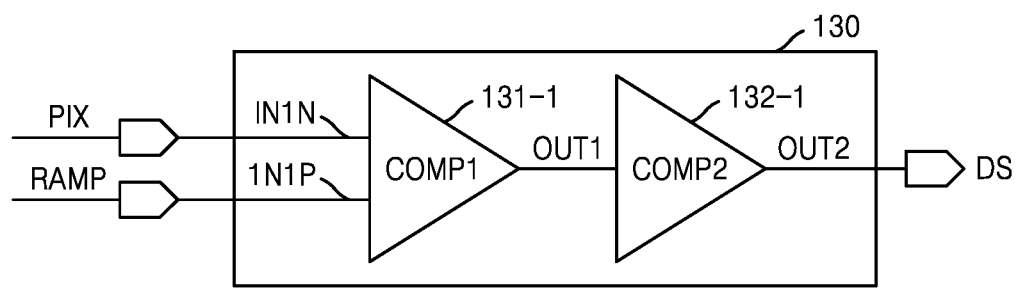
FIG. 2 illustrates a configuration of an analog-to-digital converter (ADC) according to an embodiment.

FIG. 2 illustrates a configuration of the ADC 130 according to an embodiment.

Referring to FIG. 2, the ADC 130 may have a structure having a single-slope characteristic. According to an embodiment, the ADC 130 may include a first circuit 131-1 and a second circuit 132-1. The output terminal of the first circuit 131-1 may be connected to an input terminal of the second circuit 132-1.

The first circuit 131-1 may receive a first input signal IN1P and a second input signal IN1N. The first circuit 131-1 may compare the first input signal IN1P with the second input signal IN1N and perform a decision operation. Here, the decision operation may be defined as an operation, which is performed by the first circuit 131-1 to generate a first output signal OUT1 corresponding to the ramp signal RAMP and a pixel signal PIX, so that a final output signal OUT2 is generated. Here, the decision operation may be performed when the waveform of the ramp signal RAMP crosses the waveform of the pixel signal PIX. Accordingly, when the decision operation is performed, the ADC 130 may generate the final output signal OUT2. The final output signal OUT2 may be referred to as a second output signal OUT2. The decision operation is described in detail with reference to FIGS. 6 and 7.

The first circuit 131-1 may generate the first output signal OUT1. The bandwidth of the first output signal OUT1 may be adjusted by the decision operation. A process of adjusting the bandwidth of the first output signal OUT1 by performing the decision operation is described in detail with reference to FIGS. 6 to 9.

The second circuit 132-1 may receive the first output signal OUT1 and output the second output signal OUT2. The second output signal OUT2 may correspond to a digital signal DS and may be output when the first circuit 131-1 performs a decision operation.

The configuration of the first circuit 131-1 and the second circuit 132-1 is described in detail below with reference to FIGS. 3 and 4.

Figure 3:
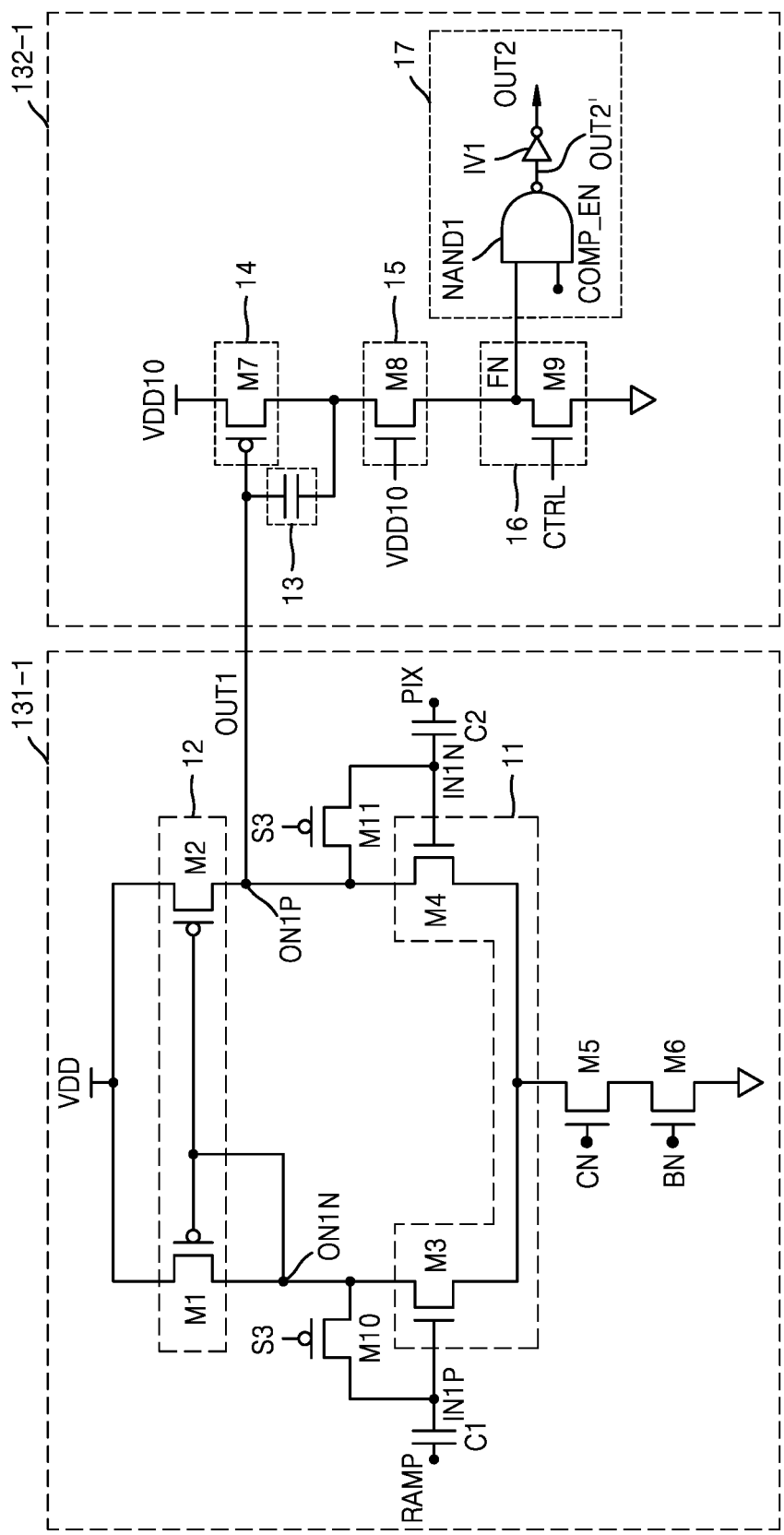
FIG. 3 is a circuit diagram of an ADC according to an embodiment.

FIG. 3 is a circuit diagram of the ADC 130 according to an embodiment. FIG. 4 illustrates the first circuit 131-1 of the ADC 130, according to an embodiment. FIG. 5 illustrates the second circuit 132-1 of the ADC 130, according to an embodiment.

Figure 4:
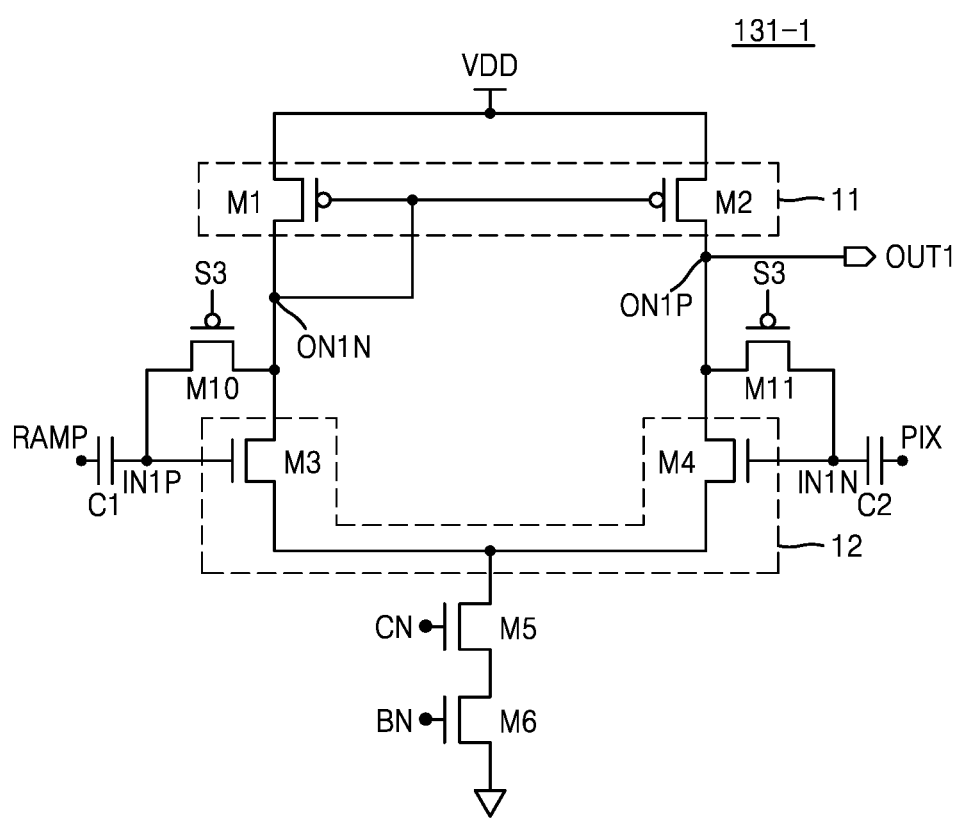
FIG. 4 illustrates a first circuit of the ADC, according to an embodiment.
Figure 5:
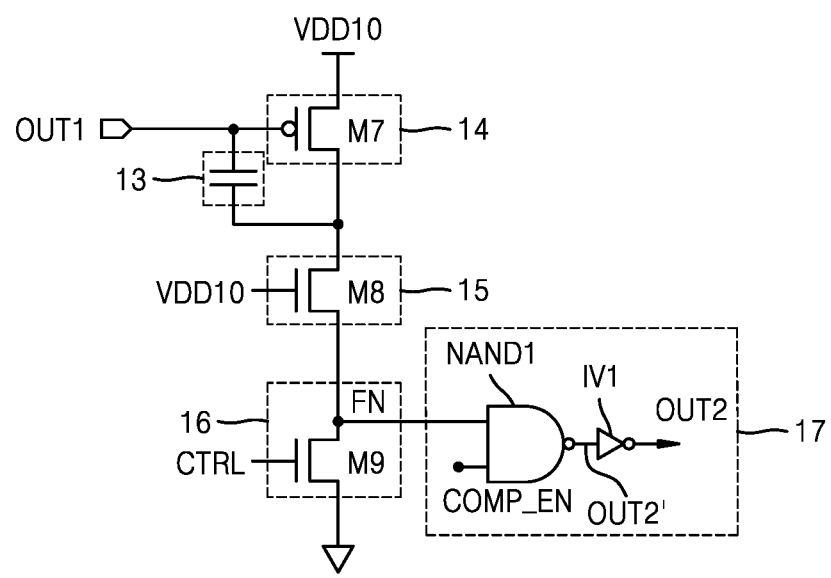
FIG. 5 illustrates a second circuit of the ADC, according to an embodiment.

Referring to FIGS. 3 and 4, the first circuit 131-1 may include an input terminal circuit 11, an output terminal circuit 12, a plurality of transistors M1 to M6, M10, and M11, and first and second capacitors C1 and C2.

The input terminal circuit 11 may receive differential inputs, e.g., the first input signal IN1P and the second input signal IN1N, and generate a differential current according to a level difference between the first input signal IN1P and the second input signal IN1N. For example, the ramp signal RAMP may be provided as the first input signal IN1P, and the pixel signal PIX may be received as the second input signal IN1N. The input terminal circuit 11 may include the transistors M3 and M4. When the first input signal IN1P is the same as the second input signal IN1N, the same current flows in the transistors M3 and M4. When the first input signal IN1P is different from the second input signal IN1N, different current flows in the transistors M3 and M4. The transistors M3 and M4 may be N-type metal-oxide-semiconductor (NMOS) transistors, i.e., N-type metal-oxide-semiconductor field-effect transistors (MOSFETs). The sum of current flowing in the transistors M3 and M4 may be equal to a bias current. In addition, the first capacitor C1 may output the first input signal IN1P by receiving the ramp signal RAMP, and the second capacitor C2 may output the second input signal IN1N by receiving the pixel signal PIX. For example, the first and second capacitors C1 and C2 may act as AZ level sampling capacitors. Furthermore, gates of the PMOS transistors M10 and M11 may receive a signal S3 from the timing controller 150 so that the PMOS transistors M10 and M11 may function as AZ switches while the first and second capacitors C1 and C2 function as level sampling capacitors.

The output terminal circuit 12 may include the transistors M1 and M2. A power supply voltage VDD may be applied to the transistors M1 and M2. The voltage level of output nodes ON1N and ON1P may be determined according to current mirroring between the transistors M1 and M2. The transistors M1 and M2 may be P-type metal-oxide-semiconductor (PMOS) transistors, i.e., P-type metal-oxide-semiconductor field-effect transistors (MOSFETs). The voltage level of the output node ON1N may be determined based on the amount of current flowing in the transistor M1 of the output terminal circuit 12, and the voltage level of the output node ON1P may be determined based on the amount of current flowing in the transistor M2 of the output terminal circuit 12. For example, when the level of the first input signal IN1P is higher than the level of the second input signal IN1N, a relatively large amount of current may flow in the transistor M1, the level of the output node ON1N may decrease, and the level of the output node ON1P may increase. The output terminal circuit 12 may output current generated based on a level difference between the first input signal IN1P and the second input signal IN1N.

The first circuit 131-1 may perform a decision operation according to the flow of current in the input terminal circuit 11 and the output terminal circuit 12 and output the first output signal OUT1. In detail, when the first input signal IN1P crosses the second input signal IN1N in the input terminal circuit 11, the first circuit 131-1 may perform the decision operation.

The first circuit 131-1 may control the flow of current in the input terminal circuit 11 and the output terminal circuit 12 through the NMOS transistors M5 and M6 as a current source by receiving control signals or bias signals BN and CN. For example, a bias current of the first circuit 131-1 may flow through the transistors M5 and M6.

Referring to FIGS. 3 and 5, an output terminal of the first circuit 131-1 may be connected to an input terminal of the second circuit 132-1. The second circuit 132-1 may receive the output of the first circuit 131-1 as an input signal.

According to an embodiment, the second circuit 132-1 may include a Miller capacitor 13, a select transistor 14 (or a select transistor M7), a control transistor 15 (or a control transistor M8), a reset transistor 16 (or a reset transistor M9), and an output circuit 17.

According to an embodiment, the select transistor 14 is connected in parallel to the Miller capacitor 13 in the second circuit 132-1. For example, the Miller capacitor 13 may be connected in parallel between an input node (e.g., a gate) and an output node (e.g., a drain) of the select transistor 14. The Miller capacitor 13 may be connected to the output terminal of the first circuit 131-1 and accumulate charges from the first circuit 131-1. When the first circuit 131-1 generates an output signal as a decision signal, the Miller capacitor 13 may discharge the accumulated charges and produce the Miller effect. Because the Miller effect occurs in the second circuit 132-1 when the first circuit 131-1 generates a decision signal, the present embodiment may limit the bandwidth of an output signal of the first circuit 131-1. Here, the moment the first circuit 131-1 generates the decision signal may be defined as a first time point, and the moment the first circuit 131-1 terminates a decision operation may be defined as a second time point. The output signal of the first circuit 131-1 may be defined as the first output signal OUT1. Because the bandwidth of the first output signal OUT1 is limited, the present embodiment may reduce noise occurring in the first circuit 131-1.

A power supply voltage VDD10 may be applied to the select transistor 14. For example, a voltage level of the power supply voltage VDD10 may be equal to or less than a voltage level of the power supply voltage VDD. The select transistor 14 may operate to allow current to flow at the first time point so that the charges accumulated in the Miller capacitor 13 are discharged. At the first time point, the first output signal OUT1 may be input to the select transistor 14. At the second time point at which the decision operation of the first circuit 131-1 is terminated, current flowing into the select transistor 14 may be cut off.

The control transistor 15 may adjust a voltage applied to the output circuit 17. Here, the output circuit 17 may have a characteristic of a NAND gate. When the output circuit 17 has the characteristic of a NAND gate, a voltage applied to the output circuit 17 may be about 1.0 V to about 2.8 V but is not limited thereto.

The reset transistor 16 may receive the counter control signal CTRL, e.g., a reset signal, from the timing controller 150 and reset a floating node FN. For example, a voltage level of the floating node FN may become a ground level (e.g., 0V) by the reset transistor 16 when the reset signal enables. Here, the counter control signal CTRL, e.g., the reset signal, may be input to the reset transistor 16 at certain intervals with a constant speed. The reset transistor 16 and the output circuit 17 may be connected to the floating node FN. Here, when the floating node FN is in a floating state, charges may accumulate in the Miller capacitor 13. When the first circuit 131-1 performs a decision operation, the floating state of the floating node FN may end, and the second circuit 132-1 may output the second output signal OUT2.

For example, the output circuit 17 may include a NAND gate NAND1 and an inverter IV1. The NAND gate NAND1 may generate a NAND output signal OUT2' by receiving a voltage level of the floating node FN and an enable signal COMP_EN. The enable signal COMP_EN may be received from the timing controller 150. The inverter IV1 may generate the second output signal OUT2 by receiving the NAND output signal OUT2'. For example, the output circuit 17 may generate the second output signal OUT2 corresponding to the decision operation of the first circuit 131-1. As described above, the output circuit 17 may have the characteristic of a NAND gate. According to an embodiment, when the first circuit 131-1 performs a decision operation, current may be applied to the select transistor 14 of the second circuit 132-1, and charges accumulated in the Miller capacitor 13 may be discharged. As a result, the current may be applied to the floating node FN. When the current is applied to the floating node FN, the output circuit 17 may output the second output signal OUT2.

Figure 6:
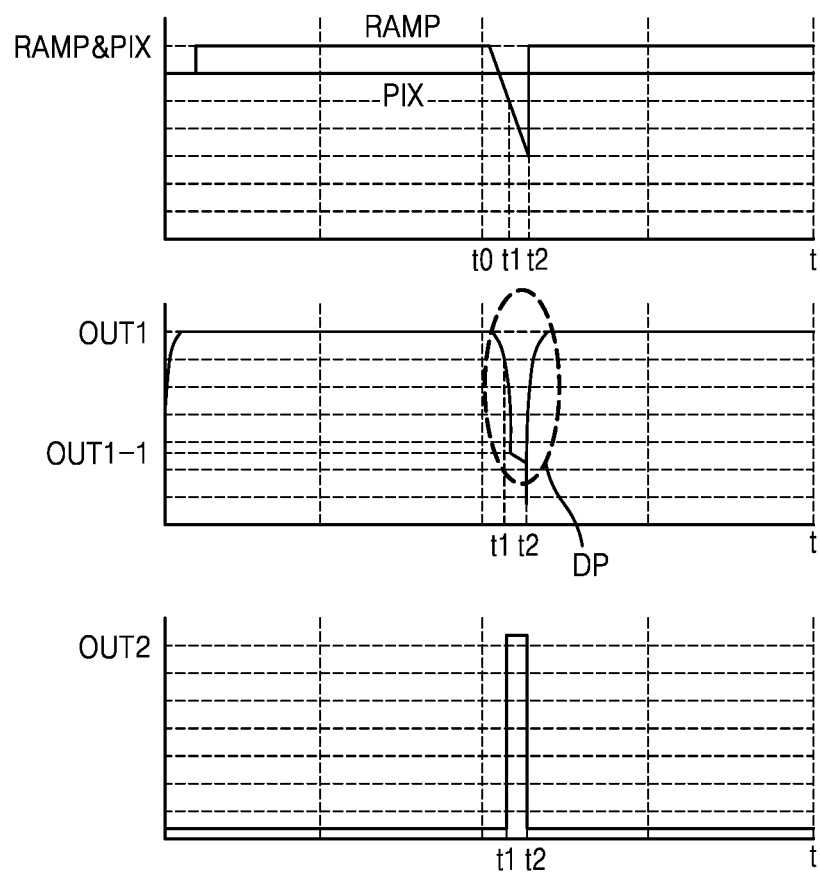
FIG. 6 is timing diagrams of signals of a first circuit and a second circuit when an ADC does not include a Miller capacitor, according to an embodiment.
Figure 7:
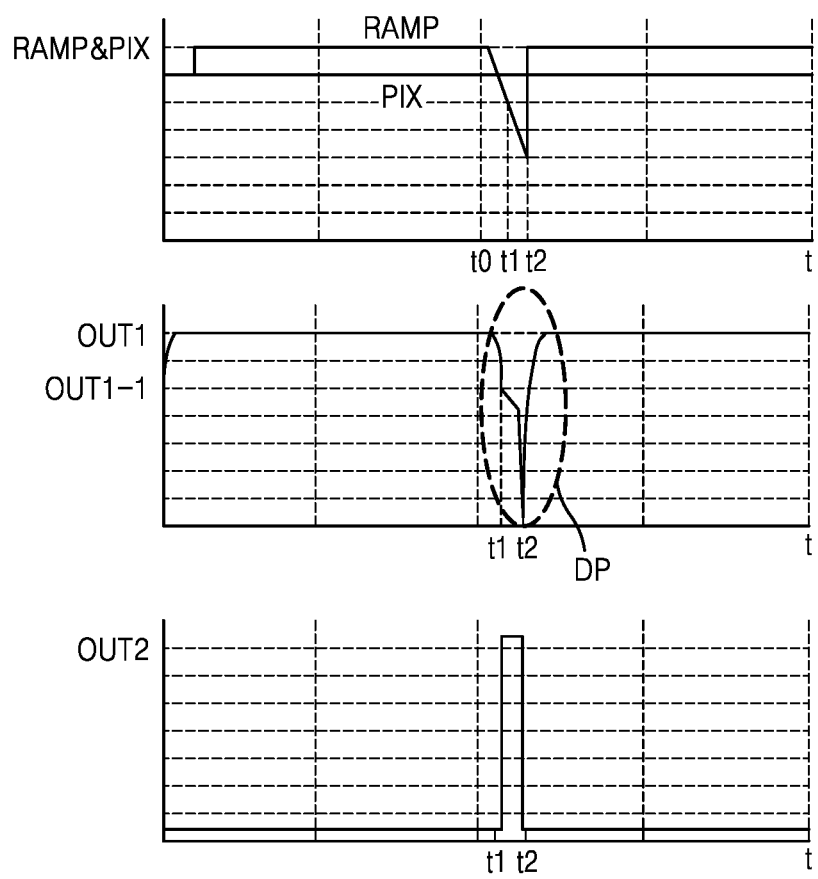
FIG. 7 is timing diagrams of signals of a first circuit and a second circuit when an ADC includes a Miller capacitor, according to an embodiment.

FIG. 6 is timing diagrams of signals of the first circuit 131-1 and the second circuit 132-1 when the ADC 130 does not include the Miller capacitor 13, according to an embodiment. FIG. 7 is timing diagrams of signals of the first circuit 131-1 and the second circuit 132-1 when the ADC 130 includes the Miller capacitor 13, according to an embodiment.

Referring to FIGS. 6 and 7, the horizontal axis represents time "t", and the vertical axis represents the ramp signal RAMP, the pixel signal PIX, the first output signal OUT1, and the second output signal OUT2. A decision operation starts at a first time point t1 and ends at a second time point t2. A period between the first time point t1 and the second time point t2 may be defined as a period in which the decision operation is performed. The interval between the first time point t1 and the second time point t2 may be different between FIGS. 6 and 7.

Referring to FIG. 6, a first period DP1, in which a decision operation is performed when the second circuit 132-1 does not include the Miller capacitor 13, may be defined to be a period between the first time point t1 and the second time point t2. In other words, the decision operation starts when the waveform of the ramp signal RAMP crosses the waveform of the pixel signal PIX. At the moment of decision, the first output signal OUT1 rapidly decreases with the decrease of the ramp signal RAMP, thereby causing noise to occur in the first circuit 131-1 and the second circuit 132-1.

Referring to FIG. 7, a second period DP2, in which a decision operation is performed when the second circuit 132-1 includes the Miller capacitor 13, may be defined to be a period between the first time point t1 and the second time point t2. The ramp signal RAMP and the pixel signal PIX have the same waveforms as those in FIG. 6. Here, the first output signal OUT1 has a waveform decreasing more slowly in the second period DP2, in which a decision operation is performed, when the second circuit 132-1 includes the Miller capacitor 13 than when the second circuit 132-1 does not include the Miller capacitor 13. Here, the Miller effect may occur in the Miller capacitor 13 of the second circuit 132-1 in the second period DP2 between the first time point t1 and the second time point t2. At the moment of decision, the pixel signal PIX is maintained constant, and accordingly, the first output signal OUT1 has a gradual preliminary decreasing period. Because the first output signal OUT1 gradually decreases as the decision operation is performed, noise may be reduced in the first circuit 131-1 and the second circuit 132-1. The second period DP2 between first time point t1 and the second time point t2 in the case where the ADC 130 includes the Miller capacitor 13 may be shorter than the first period DP1 between first time point t1 and the second time point t2 in the case where the ADC 130 does not include the Miller capacitor 13. For example, the bandwidth of the first output signal OUT1 may be limited by gradually decreasing a level of the first output signal OUT1 during the second period DP2.

When FIG. 6 is compared with FIG. 7, a lowest point OUT1-1 in the preliminary decreasing period may be lower when the ADC 130 does not include the Miller capacitor 13 than when the ADC 130 includes the Miller capacitor 13. For example, the waveform of the first output signal OUT1 when the ADC 130 does not include the Miller capacitor 13 may rapidly decrease, compared to the waveform of the first output signal OUT1 when the ADC 130 includes the Miller capacitor 13. As a result, noise occurring when the ADC 130 does not include the Miller capacitor 13 may be greater than noise occurring when the ADC 130 includes the Miller capacitor 13. For example, the second circuit 132-1 may output the second output signal OUT2 relatively fast when the ADC 130 does not include the Miller capacitor 13, compared to the second output signal OUT2 when the ADC 130 includes the Miller capacitor 13.

The waveform of the first output signal OUT1 is described in detail below with reference to FIGS. 8 and 9.

Figure 8:
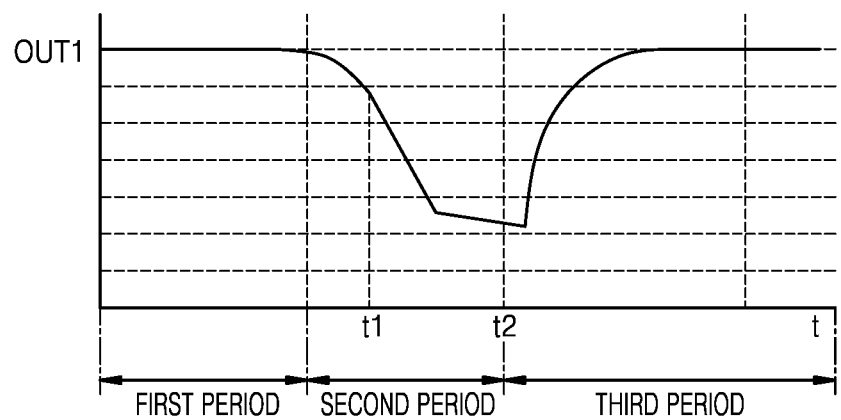
FIG. 8 illustrates a waveform of a first output signal when an ADC does not include a Miller capacitor, according to an embodiment.

FIG. 8 illustrates a waveform of the first output signal OUT1 when the ADC 130 does not include the Miller capacitor 13, according to an embodiment. FIG. 9 illustrates a waveform of the first output signal OUT1 when the ADC 130 includes the Miller capacitor 13, according to an embodiment.

Referring to FIG. 8, when the ADC 130 does not include the Miller capacitor 13, the level of the first output signal OUT1 rapidly decreases in a second period including the period between the first time point t1 and the second time point t2. When the level of the first output signal OUT1 rapidly decreases, noise may occur in the first circuit 131-1, and accordingly, the second circuit 132-1 may receive a decision signal including the noise.

Figure 9:
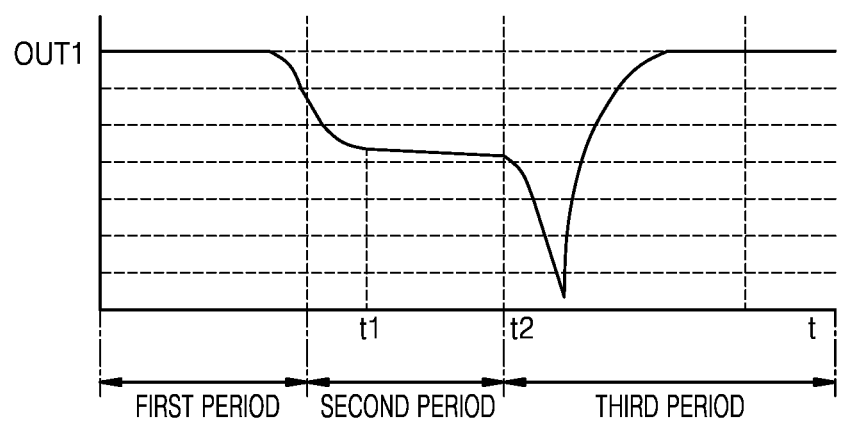
FIG. 9 illustrates a waveform of a first output signal when an ADC includes a Miller capacitor, according to an embodiment.

Referring to FIG. 9, when the ADC 130 includes the Miller capacitor 13, the level of the first output signal OUT1 gradually decreases in the second period, compared to the case where the ADC 130 does not include the Miller capacitor 13. When the level of the first output signal OUT1 gradually decreases, noise may be reduced in the first circuit 131-1, and accordingly, the second circuit 132-1 may receive a decision signal without noise. When the decision signal without noise is input to the second circuit 132-1, a decision operation may be performed quickly, compared to the case where the ADC 130 does not include the Miller capacitor 13.

Figure 10:
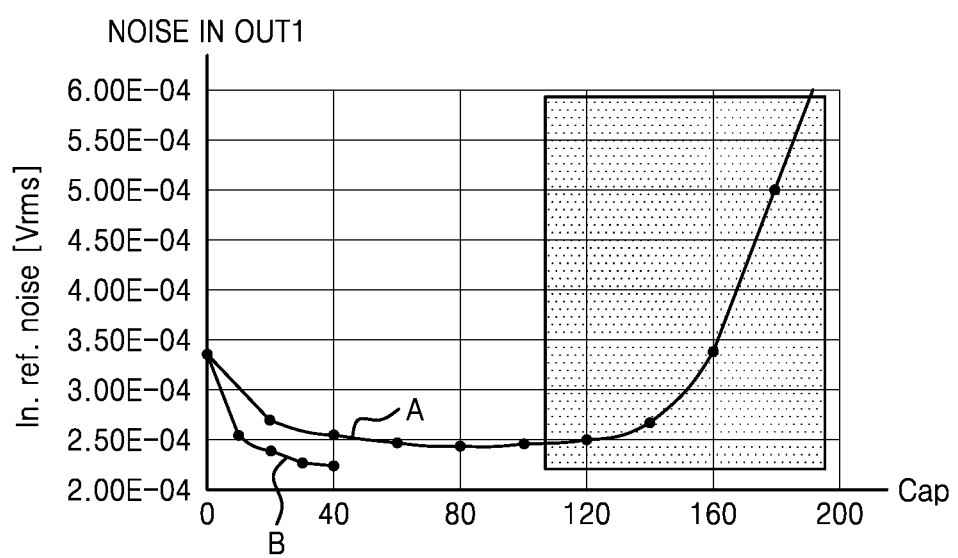
FIG. 10 illustrates a waveform of noise occurring in a first circuit when the first circuit has a first bias condition as a simulation result, according to an embodiment.
Figure 11:
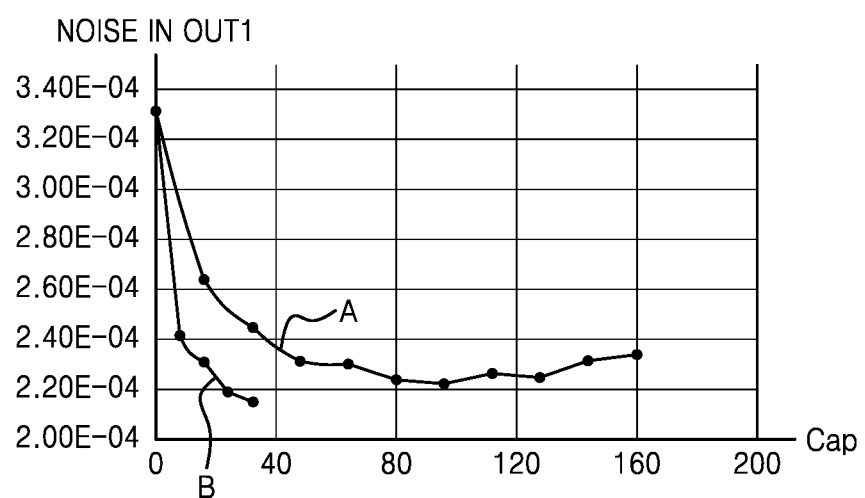
FIG. 11 illustrates a waveform of noise occurring in a first circuit when the first circuit has a second bias condition as a simulation result, according to an embodiment.

FIG. 10 illustrates a waveform of noise occurring in the first circuit 131-1 when the first circuit 131-1 has a first bias condition as a simulation result, according to an embodiment. FIG. 11 illustrates a waveform of noise occurring in the first circuit 131-1 when the first circuit 131-1 has a second bias condition as a simulation result, according to an embodiment.

Referring to FIGS. 10 and 11, the horizontal axis represents capacitance "Cap", and the vertical axis represents noise in the first output signal OUT1. The unit of the capacitance may be fF and the unit of the noise may be uV but is not limited thereto.

Referring to FIG. 10, a waveform "A" of noise occurring in the first circuit 131-1 when the ADC 130 includes a load capacitor instead of the Miller capacitor 13, noise in the first output signal OUT1 rapidly increases from a certain value of capacitance (e.g., 140). Herein, the load capacitor may be connected between the output node ON1P and a ground. In detail, when the ADC 130 includes the load capacitor, even the capacitance of the load capacitor becomes large the noise in the first output signal OUT1 may increase. On the contrary, a waveform "B" of noise occurring in the first circuit 131-1 when the ADC 130 includes the Miller capacitor 13, the noise in the first output signal OUT1 is reduced as the capacitance of the Miller capacitor 13 becomes large.

Referring to FIG. 11, a waveform "A" of noise occurring in the first circuit 131-1 when the ADC 130 includes the load capacitor, noise in the first output signal OUT1 slightly increase from the certain value of capacitance. On the contrary, a waveform "B" of noise occurring in the first circuit 131-1 when the ADC 130 includes the Miller capacitor 13, the noise in the first output signal OUT1 is reduced as the capacitance of the Miller capacitor 13 becomes large. In detail, when the ADC 130 includes the Miller capacitor 13, the noise may not occur or may be reduced in the first output signal OUT1. For example, the noise in the first output signal OUT1 may be reduced even when the ADC 130 includes the Miller capacitor 13 having a small capacitance compared to the load capacitor.

Figure 12:
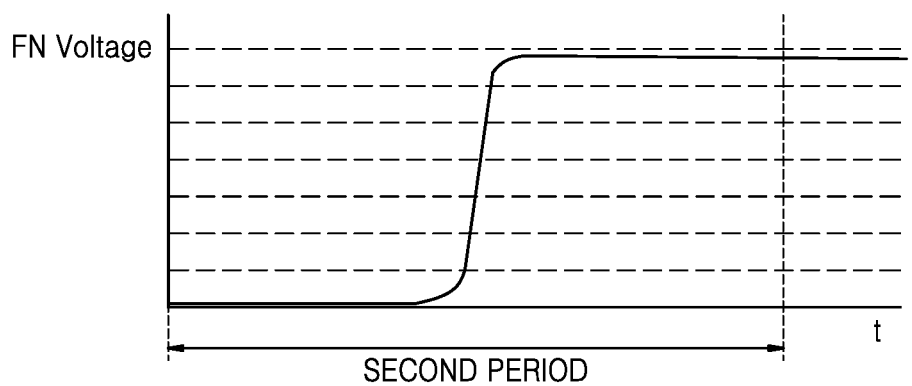
FIG. 12 illustrates a waveform of a voltage signal applied to a floating node while an ADC is performing a decision operation, according to an embodiment.

FIG. 12 illustrates a waveform of a voltage signal applied to the floating node FN while the ADC 130 is performing a decision operation, according to an embodiment.

Referring to FIG. 12, according to an embodiment, the ADC 130 may perform a decision operation when the floating node FN floats in the second period. When the decision operation is performed, current flows in the select transistor 14, and charges are discharged from the Miller capacitor 13. Accordingly, the floating state of the floating node FN may end.

Figure 13:
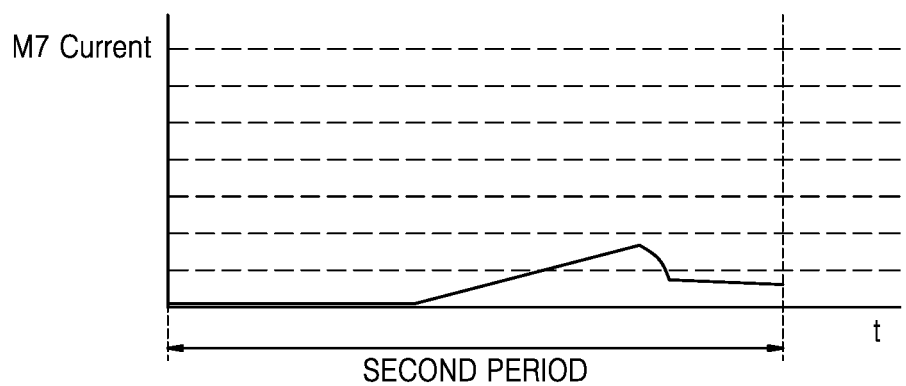
FIG. 13 illustrates a waveform of a current flowing in a select transistor of a second circuit, according to an embodiment.

FIG. 13 illustrates a waveform of a current flowing in the select transistor M7 (or the select transistor 14) of the second circuit 132-1, according to an embodiment.

Referring to FIG. 13, current flows in the select transistor 14 in the second period, in which a decision operation is performed. In detail, during the decision operation, charges accumulated in the Miller capacitor 13 are discharged, generating current, and capacitance between input and output terminals of the select transistor 14 is amplified by the first output signal OUT1 received from the first circuit 131-1. As a result, the capacitance of the first output signal OUT1 increases, and noise occurring in the first circuit 131-1 and the second circuit 132-1 decreases.

Figure 14:
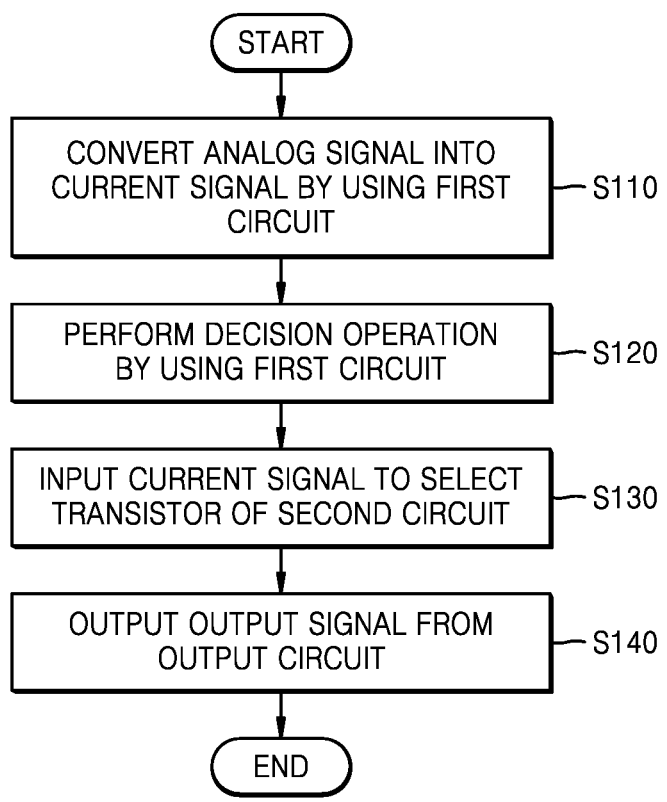
FIG. 14 is a flowchart of a method in which an ADC processes a signal, according to an embodiment.

FIG. 14 is a flowchart of a method in which the ADC 130 processes a signal, according to an embodiment.

Referring to FIG. 14, the first circuit 131-1 may convert an analog signal into a current signal in operation S110. For example, the first circuit 131-1 may receive a pixel signal from pixels PX and a ramp signal from the ramp signal generator 140 and generate current signals for generating the first output signal OUT1.

When the first input signal IN1P and the second input signal IN1N of the first circuit 131-1 cross each other in the input terminal circuit 11, a decision operation may be performed by the first circuit 131-1 in operation S120.

When the decision operation is performed, the current signal from the first circuit 131-1 may be input to the select transistor 14 of the second circuit 132-1 in operation S130. In detail, during the decision operation, charges accumulated in the Miller capacitor 13 may be discharged, producing current, and the current of the first output signal OUT1 of the first circuit 131-1 may be input to the select transistor 14.

When the decision operation is performed, the output circuit 17 may generate and output the second output signal OUT2 in operation S140. Here, the second output signal OUT2 may correspond to the digital signal DS.

Figure 15:
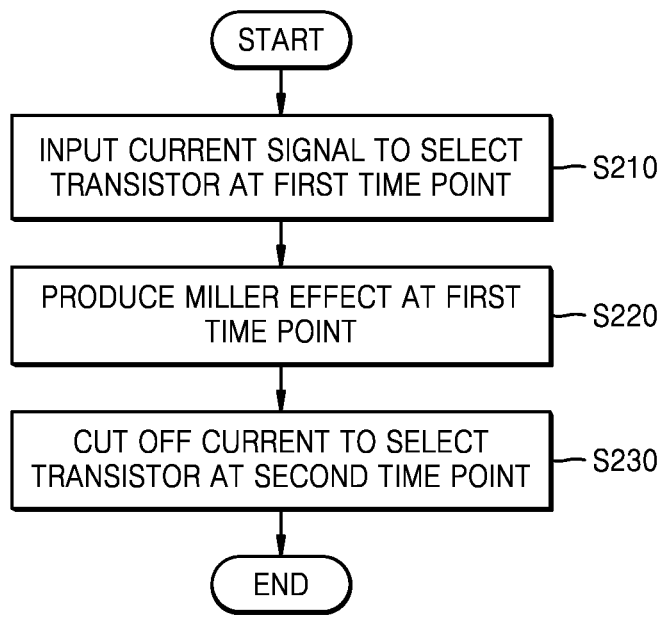
FIG. 15 is a flowchart of a method in which a Miller effect occurs in an ADC, according to an embodiment.

FIG. 15 is a flowchart of a method in which a Miller effect occurs in an ADC, according to an embodiment. Here, the first time point may be defined to be the moment when a decision operation starts. The second time point may be defined to be the moment when the decision operation ends.

Referring to FIG. 15, a current signal may be input to the select transistor 14 at the first time point in operation S210. The current signal may refer to current, which is input to the second circuit 132-1 via the first output signal OUT1.

When the current signal is input to the select transistor 14, the Miller effect may be produced at the first time point in operation S220. In detail, during the decision operation, charges accumulated in the Miller capacitor 13 are discharged, generating current, and capacitance between the input and output terminals of the select transistor 14 is amplified by the first output signal OUT1 received from the first circuit 131-1. As a result, the capacitance of the first output signal OUT1 increases, and noise occurring in the first circuit 131-1 and the second circuit 132-1 decreases.

At the second time point at which the decision operation is completed, current to the select transistor 14 may be cut off in operation S230. When the current to the select transistor 14 is cut off, charges may be newly accumulated in the Miller capacitor 13, and noise, which occurs in the first circuit 131-1 and the second circuit 132-1 during a subsequent decision operation, may be decreased.

Figure 16:
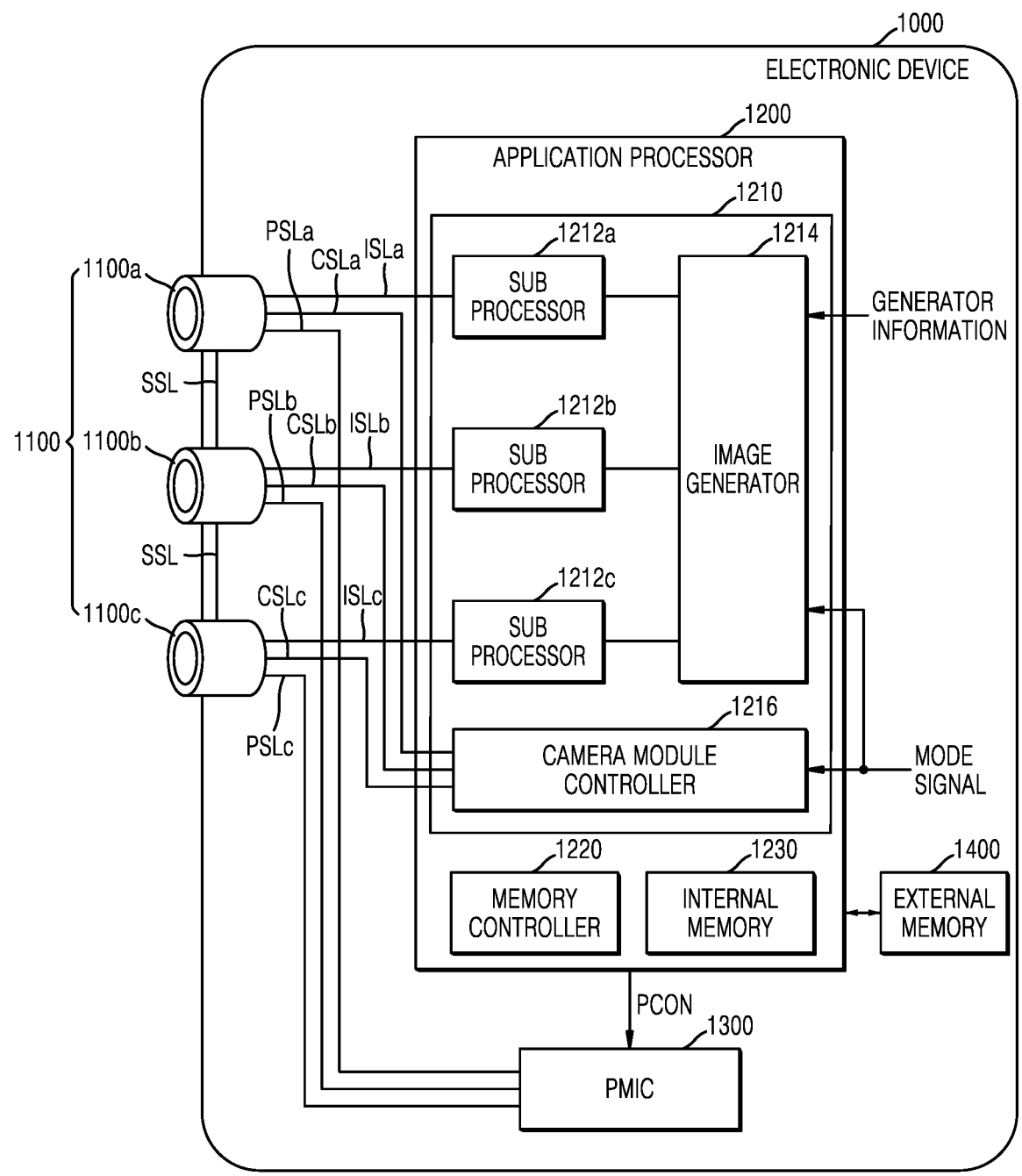
FIGS. 16 and 17 are block diagrams of electronic devices including a multi-camera module according to example embodiments.
Figure 17:
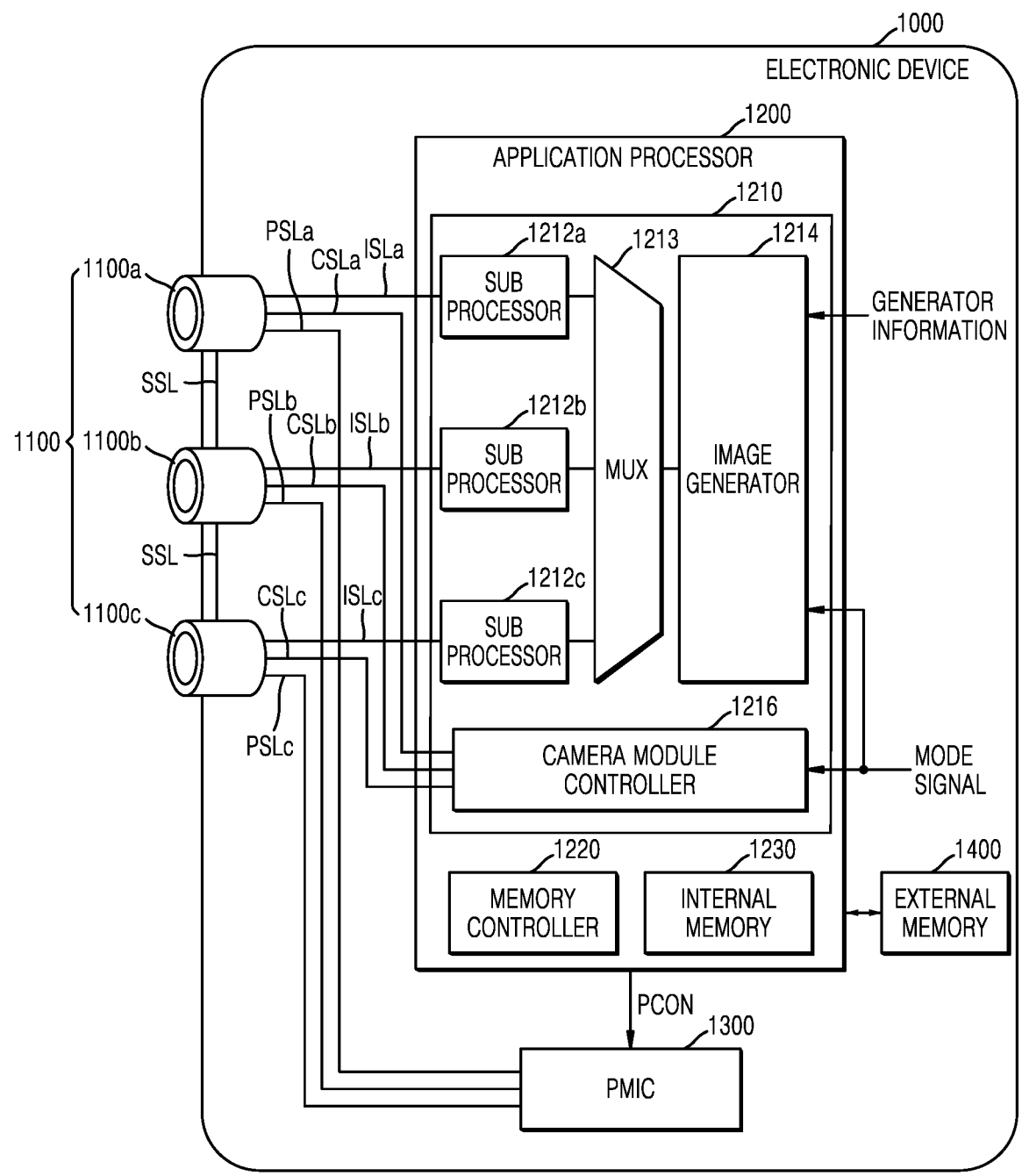

FIGS. 16 and 17 are block diagrams of electronic devices including a multi-camera module according to example embodiments.

Figure 18:
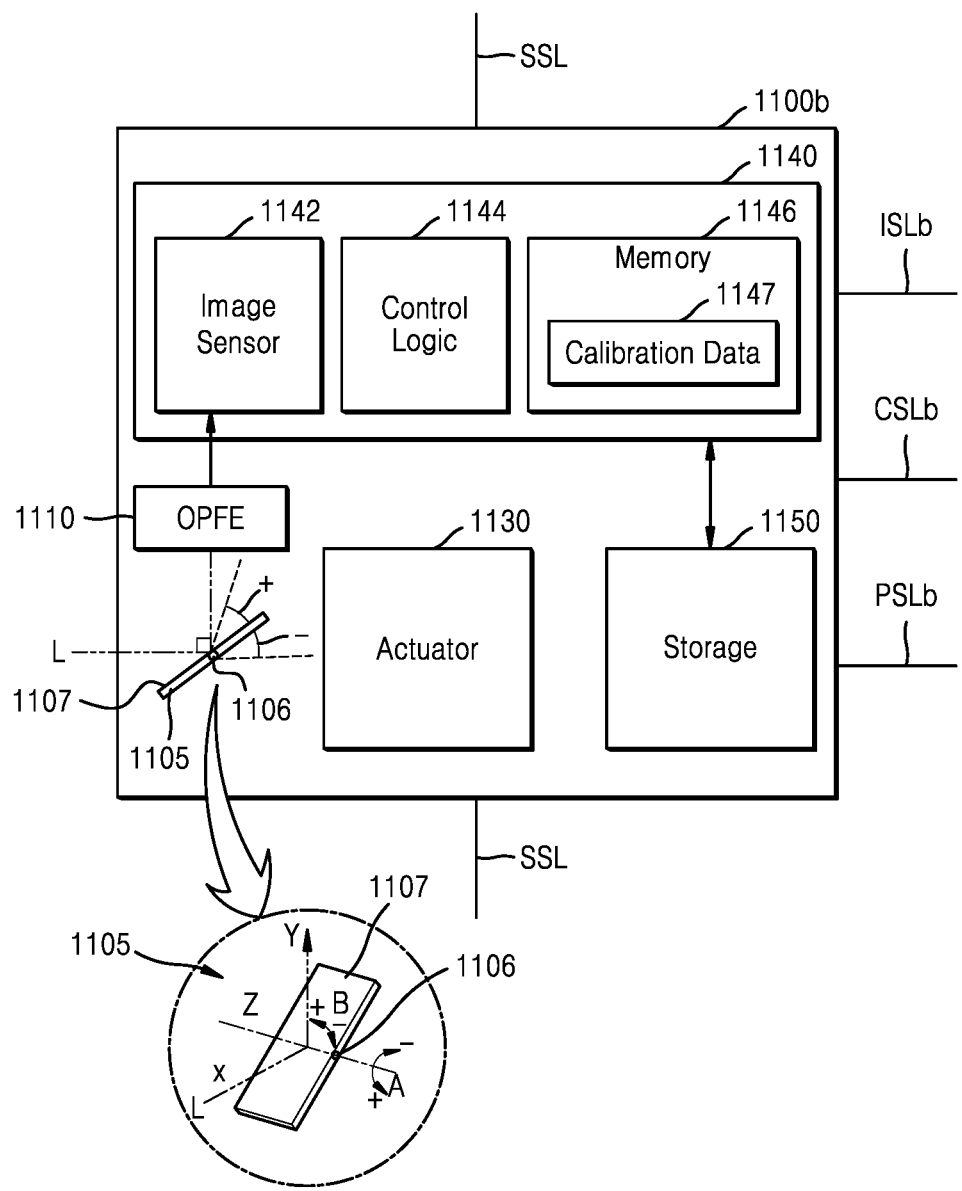
FIG. 18 is a detailed block diagram of a camera module according to example embodiments.

FIG. 18 is a detailed block diagram of a camera module according to example embodiments.

Referring to FIG. 16, an electronic device 1000 may include a camera module group 1100, an application processor 1200, a power management integrated circuit (PMIC) 1300, and an external memory 1400.

The camera module group 1100 may include a plurality of camera modules 1100a, 1100b, and 1100c. Although three camera modules 1100a, 1100b, and 1100c are illustrated in FIG. 16, embodiments are not limited thereto. In some embodiments, the camera module group 1100 may be modified to include only two camera modules or include "n" camera modules, where "n" is a natural number equal to or greater than 4.

The detailed configuration of the camera module 1100b is described with reference to FIG. 18 below. The descriptions below may also be applied to the other camera modules 1100a and 1100c.

Referring to FIG. 18, the camera module 1100b may include a prism 1105, an optical path folding element (OPFE) 1110, an actuator 1130, an image sensing device 1140, and a storage 1150.

The prism 1105 may include a reflective surface 1107 of a light reflecting material and may change the path of light L incident from outside.

In some embodiments, the prism 1105 may change the path of the light L incident in a first direction X into a second direction Y perpendicular to the first direction X. The prism 1105 may rotate the reflective surface 1107 of the light reflecting material in a direction A around a central shaft 1106 or rotate the central shaft 1106 in a direction B so that the path of the light L incident in the first direction X is changed into the second direction Y perpendicular to the first direction X. At this time, the OPFE 1110 may move in a third direction Z, which is perpendicular to the first and second directions X and Y.

In some embodiments, an A-direction maximum rotation angle of the prism 1105 may be less than or equal to 15 degrees in a plus (+) A direction and greater than 15 degrees in a minus (−) A direction, but embodiments are not limited thereto.

In some embodiment, the prism 1105 may move by an angle of about 20 degrees or in a range from about 10 degrees to about 20 degrees or from about 15 degrees to about 20 degrees in a plus or minus B direction. At this time, an angle by which the prism 1105 moves in the plus B direction may be the same as or similar, within a difference of about 1 degree, to an angle by which the prism 1105 moves in the minus B direction.

In some embodiments, the prism 1105 may move the reflective surface 1107 of the light reflecting material in the third direction Z parallel with an extension direction of the central shaft 1106.

In some embodiments, the camera module 1100b may include at least two prisms and variously change the path of the light L by using the prisms. For example, the camera module 1100b may change the direction of the path of the light L incident in the first direction X to the second direction Y perpendicular to the first direction X, then to the first direction X or the third direction Z, and then to the second direction Y.

The OPFE 1110 may include, for example, "m" optical lenses, where "m" is a natural number. The "m" lenses may move in the second direction Y and change an optical zoom ratio of the camera module 1100b. For example, when the default optical zoom ratio of the camera module 1100b is Z, the optical zoom ratio of the camera module 1100b may be changed to 3Z, 5Z, or greater by moving the "m" optical lenses included in the OPFE 1110.

The actuator 1130 may move the OPFE 1110 (or an optical lens) (hereinafter, referred to as an optical lens) to a certain position. For example, the actuator 1130 may adjust the position of the optical lens such that an image sensor 1142 is at a focal length of the optical lens for accurate sensing.

The image sensing device 1140 may include the image sensor 1142, a control logic 1144, and a memory 1146. The image sensor 1142 may sense an image of an object by using the light L provided through the optical lens. The control logic 1144 may generally control operations of the camera module 1100b and process a sensed image. For example, the control logic 1144 may control operation of the camera module 1100b, according to a control signal provided through a control signal line CSLb, and extract image data corresponding to a particular image (e.g., the face, arms, legs, or the like of a person) from the sensed image.

In some embodiments, the control logic 1144 may perform image processing, such as encoding or noise reduction, on the sensed image.

The memory 1146 may store information, such as calibration data 1147, necessary for the operation of the camera module 1100b. The calibration data 1147 may include information, which is necessary for the camera module 1100b to generate image data using the light L provided from outside. For example, the calibration data 1147 may include information about the degree of rotation described above, information about a focal length, information about an optical axis, or the like. When the camera module 1100b is implemented as a multi-state camera that has a focal length varying with the position of the optical lens, the calibration data 1147 may include a value of a focal length for each position (or state) of the optical lens and information about auto focusing.

The storage 1150 may store image data sensed by the image sensor 1142. The storage 1150 may be provided outside the image sensing device 1140 and may form a stack with a sensor chip of the image sensing device 1140. In some embodiments, two chips may be stacked, wherein the image sensor 1142 may be formed in one of the chips, and the control logic 1144, the storage 1150, and the memory 1146 may be formed in the other chip.

In some embodiments, the storage 1150 may include electrically erasable programmable read-only memory (EEPROM), but embodiments are not limited thereto. In some embodiments, the image sensor 1142 and the control logic 1144 may respectively correspond to the image sensor 100 and the ADC 130 disclosed above. For example, the image sensor 1142 may include the pixel array 110, and the control logic 1144 may include the ADC 130 and the processor 160 processing a sensed image.

Referring to FIGS. 16 and 18, in some embodiments, each of the camera modules 1100a, 1100b, and 1100c may include the actuator 1130. Accordingly, the camera modules 1100a, 1100b, and 1100c may include the calibration data 1147, which is the same or different among the camera modules 1100a, 1100b, and 1100c according to the operation of the actuator 1130 included in each of the camera modules 1100a, 1100b, and 1100c.

In some embodiments, one (e.g., the camera module 1100b) of the camera modules 1100a, 1100b, and 1100c may be of a folded-lens type including the prism 1105 and the OPFE 1110 while the other camera modules (e.g., the camera modules 1100a and 1100c) may be of a vertical type that does not include the prism 1105 and the OPFE 1110. However, embodiments are not limited thereto.

In some embodiments, one (e.g., the camera module 1100c) of the camera modules 1100a, 1100b, and 1100c may include a vertical depth camera, which extracts depth information using an infrared ray (IR). In this case, the application processor 1200 may generate a three-dimensional (3D) depth image by merging image data provided from the depth camera with image data provided from another camera module (e.g., the camera module 1100a or 1100b).

In some embodiments, at least two camera modules (e.g., 1100a and 1100b) among the camera modules 1100a, 1100b, and 1100c may have different field-of-views. In this case, the two camera modules (e.g., 1100a and 1100b) among the camera modules 1100a, 1100b, and 1100c may respectively have different optical lenses, but embodiments are not limited thereto.

In some embodiments, the camera modules 1100a, 1100b, and 1100c may have different field-of-views from one another. For example, the camera module 1100a may include an ultrawide camera, the camera module 1100b may include a wide camera, and the camera module 1100c may include a telecamera, but embodiments are not limited thereto. In this case, the camera modules 1100a, 1100b, and 1100c may respectively have different optical lenses, but embodiments are not limited thereto.

In some embodiments, the camera modules 1100a, 1100b, and 1100c may be physically separated from one another. In other words, the sensing area of the image sensor 1142 is not divided and used by the camera modules 1100a, 1100b, and 1100c, but the image sensor 1142 may be independently included in each of the camera modules 1100a, 1100b, and 1100c.

Referring back to FIG. 16, the application processor 1200 may include an image processing unit 1210, a memory controller 1220, and an internal memory 1230. The application processor 1200 may be separately implemented from the camera modules 1100a, 1100b, and 1100c. For example, the application processor 1200 may be implemented in a different semiconductor chip than the camera modules 1100a, 1100b, and 1100c.

The image processing unit 1210 may include a plurality of sub image processors 1212a, 1212b, and 1212c, an image generator 1214, and a camera module controller 1216.

The image processing unit 1210 may include as many sub image processors 1212a, 1212b, and 1212c as the camera modules 1100a, 1100b, and 1100c.

Image data generated from the camera module 1100a may be provided to the sub image processor 1212a through an image signal line ISLa, image data generated from the camera module 1100b may be provided to the sub image processor 1212b through an image signal line ISLb, and image data generated from the camera module 1100c may be provided to the sub image processor 1212c through an image signal line ISLc. Such image data transmission may be performed using, for example, a mobile industry processor interface (MIPI)-based camera serial interface (CSI), but embodiments are not limited thereto.

In some embodiments, a single sub image processor may be provided for a plurality of camera modules. For example, differently from FIG. 16, the sub image processors 1212a and 1212c may not be separate from each other but may be integrated into a single sub image processor, and the image data provided from the camera module 1100a or the camera module 1100c may be selected by a selection element (e.g., a multiplexer) and then provided to the integrated sub image processor. At this time, the sub image processor 1212b may not be integrated and may receive image data from the camera module 1100b.

In some embodiments, image data generated from the camera module 1100a may be provided to the sub image processor 1212a through the image signal line ISLa, image data generated from the camera module 1100b may be provided to the sub image processor 1212b through the image signal line ISLb, and image data generated from the camera module 1100c may be provided to the sub image processor 1212c through the image signal line ISLc. In addition, while the image data processed by the sub image processor 1212b may be directly provided to the image generator 1214, one of the image data processed by the sub image processor 1212a and the image data processed by the sub image processor 1212c may be selected by a selection element (e.g., a multiplexer) and then provided to the image generator 1214.

Each of the sub image processors 1212a, 1212b, and 1212c may perform image processing, such as bad pixel correction, 3A adjustment (i.e., autofocus correction, auto-white balance, and auto-exposure), noise reduction, sharpening, gamma control, or remosaic, on image data provided from a corresponding one of the camera modules 1100a, 1100b, and 1100c.

In some embodiments, remosaic signal processing may be performed by each of the camera modules 1100a, 1100b, and 1100c, and a processing result may be provided to each of the sub image processors 1212a, 1212b, and 1212c.

The image data processed by each of the sub image processors 1212a, 1212b, and 1212c may be provided to the image generator 1214. The image generator 1214 may generate an output image using the image data provided from each of the sub image processors 1212a, 1212b, and 1212c according to image generation information or a mode signal.

In detail, the image generator 1214 may generate the output image by merging at least portions of respective pieces of image data, which are respectively generated from the sub image processors 1212a, 1212b, and 1212c, according to the image generation information or the mode signal. Alternatively, the image generator 1214 may generate the output image by selecting one of pieces of image data, which are respectively generated from the sub image processors 1212a, 1212b, and 1212c, according to the image generation information or the mode signal.

In some embodiments, the image generation information may include a zoom signal or a zoom factor. In some embodiments, the mode signal may be based on a mode selected by a user.

When the image generation information includes a zoom signal or a zoom factor and the camera modules 1100a, 1100b, and 1100c have different field-of-views, the image generator 1214 may perform different operations according to different kinds of zoom signals. For example, when the zoom signal is a first signal, the image generator 1214 may generate an output image using image data output from the sub image processor 1212b and image data output from the sub image processor 1212a between the image data output from the sub image processor 1212a and image data output from the sub image processor 1212c. When the zoom signal is a second signal different from the first signal, the image generator 1214 may generate an output image using image data output from the sub image processor 1212b and image data output from the sub image processor 1212c between image data output from the sub image processor 1212a and the image data output from the sub image processor 1212c. When the zoom signal is a third signal different from the first signal and the second signal, the image generator 1214 may generate an output image by selecting one of the pieces of image data respectively output from the sub image processors 1212a, 1212b, and 1212c, instead of performing the merging. However, embodiments are not limited thereto, and a method of processing image data may be changed whenever necessary.

Referring to FIG. 17, in some embodiments, the image processing unit 1210 may further include a selector 1213, which selects and transmits the outputs of the sub image processors 1212a, 1212b, and 1212c to the image generator 1214.

In this case, the selector 1213 may perform a different operation according to a zoom signal or a zoom factor. For example, when the zoom signal is a fourth signal (for example, when a zoom ratio is a first ratio), the selector 1213 may select and transmit one of the outputs of the sub image processors 1212a, 1212b, and 1212c to the image generator 1214.

When the zoom signal is a fifth signal different from the fourth signal (for example, when the zoom ratio is a second ratio), the selector 1213 may sequentially transmit "p" outputs (where "p" is a natural number of at least 2) among the outputs of the sub image processors 1212a, 1212b, and 1212c to the image generator 1214. For example, the selector 1213 may sequentially transmit the output of the sub image processor 1212b and the output of the sub image processor 1212c to the image generator 1214. For example, the selector 1213 may sequentially transmit the output of the sub image processor 1212a and the output of the sub image processor 1212b to the image generator 1214. The image generator 1214 may merge the sequentially received "p" outputs with each other and generate a single output image.

At this time, image processing, such as demosaic, down scaling to a video/preview resolution, gamma correction, and high dynamic range (HDR) processing, may be performed by the sub image processors 1212a, 1212b, and 1212c, and processed image data may be transmitted to the image generator 1214. Accordingly, although the processed image is provided from the selector 1213 to the image generator 1214 through a single signal line, the image merging operation of the image generator 1214 may be performed at a high speed.

In some embodiments, the image generator 1214 may receive a plurality of pieces of image data, which have different exposure times, from at least one of the sub image processors 1212a, 1212b, and 1212c and perform HDR processing on the pieces of image data, thereby generating merged image data having an increased dynamic range.

The camera module controller 1216 may provide a control signal to each of the camera modules 1100a, 1100b, and 1100c. A control signal generated by the camera module controller 1216 may be provided to a corresponding one of the camera modules 1100a, 1100b, and 1100c through a corresponding one of control signal lines CSLa, CSLb, and CSLc, which are separate from one another.

One (e.g., the camera module 1100b) of the camera modules 1100a, 1100b, and 1100c may be designated as a master camera according to the mode signal or the image generation signal including a zoom signal, and the other camera modules (e.g., 1100a and 1100c) may be designated as slave cameras. Such designation information may be included in a control signal and provided to each of the camera modules 1100a, 1100b, and 1100c through a corresponding one of control signal lines CSLa, CSLb, and CSLc, which are separate from one another.

A camera module operating as a master or a slave may be changed according to a zoom factor or an operation mode signal. For example, when the field-of-view of the camera module 1100a is greater than that of the camera module 1100b and the zoom factor indicates a low zoom ratio, the camera module 1100a may operate as a master and the camera module 1100b may operate as a slave. Contrarily, when the zoom factor indicates a high zoom ratio, the camera module 1100b may operate as a master and the camera module 1100a may operate as a slave.

In some embodiments, a control signal provided from the camera module controller 1216 to each of the camera modules 1100a, 1100b, and 1100c may include a sync enable signal. For example, when the camera module 1100b is a master camera and the camera modules 1100a and 1100c are slave cameras, the camera module controller 1216 may transmit the sync enable signal to the camera module 1100b. The camera module 1100b provided with the sync enable signal may generate a sync signal based on the sync enable signal and may provide the sync signal to the camera modules 1100a and 1100c through a sync signal line SSL. The camera modules 1100a, 1100b, and 1100c may be synchronized with the sync signal and may transmit image data to the application processor 1200.

In some embodiments, a control signal provided from the camera module controller 1216 to each of the camera modules 1100a, 1100b, and 1100c may include mode information according to the mode signal. The camera modules 1100a, 1100b, and 1100c may operate in a first operation mode or a second operation mode in relation with a sensing speed, based on the mode information.

In the first operation mode, the camera modules 1100a, 1100b, and 1100c may generate an image signal at a first speed (e.g., at a first frame rate), encode the image signal at a second speed higher than the first speed (e.g., at a second frame rate higher than the first frame rate), and transmit an encoded image signal to the application processor 1200. At this time, the second speed may be at most 30 times the first speed.

The application processor 1200 may store the received image signal, i.e., the encoded image signal, in the internal memory 1230 therein or the external memory 1400 outside the application processor 1200. Thereafter, the application processor 1200 may read the encoded image signal from the internal memory 1230 or the external memory 1400, decode the encoded image signal, and display image data generated based on a decoded image signal. For example, a corresponding one of the sub image processors 1212a, 1212b, and 1212c of the image processing unit 1210 may perform the decoding and may also perform image processing on the decoded image signal.

In the second operation mode, the camera modules 1100a, 1100b, and 1100c may generate an image signal at a third speed lower than the first speed (e.g., at a third frame rate lower than the first frame rate) and transmit the image signal to the application processor 1200. The image signal provided to the application processor 1200 may not have been encoded. The application processor 1200 may perform image processing on the image signal or store the image signal in the internal memory 1230 or the external memory 1400.

The PMIC 1300 may provide power, e.g., a power supply voltage, to each of the camera modules 1100a, 1100b, and 1100c. For example, under control by the application processor 1200, the PMIC 1300 may provide first power to the camera module 1100a through a power signal line PSLa, second power to the camera module 1100b through a power signal line PSLb, and third power to the camera module 1100c through a power signal line PSLc.

The PMIC 1300 may generate power corresponding to each of the camera modules 1100a, 1100b, and 1100c and adjust the level of the power, in response to a power control signal PCON from the application processor 1200. The power control signal PCON may include a power adjustment signal for each operation mode of the camera modules 1100a, 1100b, and 1100c. For example, the operation mode may include a low-power mode. At this time, the power control signal PCON may include information about a camera module to operate in the low-power mode and a power level to be set. The same or different levels of power may be respectively provided to the camera modules 1100a, 1100b, and 1100c. The level of power may be dynamically changed.

While the inventive concept has been particularly shown and described with reference to embodiments thereof, it will be understood that various changes in form and details may be made therein without departing from the spirit and scope of the following claims.

What is claimed is:

1. An image sensing device comprising:
    a pixel array including a plurality of pixels; and
    an analog-to-digital converter (ADC) configured to convert an analog signal into a digital signal,
    wherein the ADC includes:
    a first circuit configured to receive the analog signal from a selected pixel among the plurality of pixels and generate a first output signal; and
    a second circuit including a select transistor configured to apply a voltage to a floating node electrically connected to the select transistor based on the first output signal,
    wherein the second circuit further includes:
    a capacitor connected in parallel between a gate and a drain of the select transistor;
    a control transistor connected between the select transistor and the floating node, and configured to adjust the voltage applied to the floating node in response to a second power supply voltage;
    a reset transistor connected between the floating node and a ground, and configured to reset the voltage applied to the floating node, and
    an output circuit connected to the floating node and configured to output the digital signal based on the applied voltage to the floating node, and
    wherein the select transistor is configured to be applied with the second power supply voltage.

2. The image sensing device of claim 1, wherein the first circuit is configured to be applied with a first power supply voltage, and
    wherein a level of the first power supply voltage is different from a level of the second power supply voltage.

3. The image sensing device of claim 1, wherein the reset transistor is configured to reset the voltage applied to the floating node in response to a counter control signal.

4. The image sensing device of claim 1, wherein the second circuit is configured to produce a Miller effect in the select transistor and to flow current in the select transistor, at a first time point at which the first circuit generates a decision signal as the first output signal and starts a decision operation.

5. The image sensing device of claim 4, wherein the second circuit is configured to apply a predefined voltage to the floating node and cut off the select transistor at a second time point after the first time point at which the first circuit completes the decision operation.

6. The image sensing device of claim 1, wherein the output circuit includes:
a NAND gate including a first input connected to the floating node, and the NAND gate configured to output a NAND output signal based on the voltage of the floating node; and
an inverter configured to output the digital signal based on the NAND output signal.

7. The image sensing device of claim 1, wherein:
the analog signal is a second input signal,
the first circuit includes a comparator configured to compare a first input signal with the second input signal and generate a current signal as the first output signal, and
the first input signal is output from a ramp signal generator.

8. The image sensing device of claim 7, wherein the first circuit includes:
an input terminal circuit configured to receive the first input signal and the second input signal; and
an output terminal circuit configured to generate the first output signal based on the first and second input signals, and
wherein the first circuit is configured to perform a decision operation when the first input signal crosses the second input signal in the input terminal circuit.

9. The image sensing device of claim 1, wherein the capacitor is configured to accumulate charges when the floating node is floating.

10. An analog-to-digital converter (ADC) comprising:
a first circuit configured to receive an analog signal from a plurality of pixels of an image sensing device and generate a first output signal; and
a second circuit including a select transistor configured to apply a voltage to a floating node electrically connected to the select transistor based on the first output signal,
wherein the second circuit further includes:
a capacitor connected in parallel between a gate and a drain of the select transistor; and
an output circuit connected to the floating node and configured to output a second output signal based on the applied voltage to the floating node,
wherein the first circuit is configured to be applied with a first power supply voltage,
wherein the select transistor is configured to be applied with a second power supply voltage, and
wherein a level of the first power supply voltage is different from a level of the second power supply voltage.

11. The ADC of claim 10, wherein the second circuit further includes a control transistor configured to adjust the voltage applied to the floating node.

12. The ADC of claim 10, wherein the second circuit further includes a reset transistor configured to reset the voltage applied to the floating node.

13. The ADC of claim 10, wherein the second circuit is configured to produce a Miller effect in the select transistor and to flow current in the select transistor, at a first time point at which the first circuit generates a decision signal as the first output signal and starts a decision operation.

14. The ADC of claim 13, wherein the second circuit is configured to apply a predefined voltage to the floating node and cut off the select transistor at a second time point after the first time point at which the first circuit completes the decision operation.

15. The ADC of claim 10, wherein the analog signal is a second input signal, and
wherein the first circuit is configured to compare a first input signal from a ramp generator with the second input signal and generate the first output signal as a comparison result.

16. The ADC of claim 15, wherein the first circuit includes:
an input terminal circuit configured to receive the first input signal and the second input signal; and
an output terminal circuit configured to generate the first output signal based on the first and second input signals, and
wherein the first circuit is configured to perform a decision operation when the first input signal crosses the second input signal in the input terminal circuit.

17. The ADC of claim 10, wherein the output circuit includes:
a NAND gate including a first input connected to the floating node, and the NAND gate configured to output a NAND output signal based on the voltage of the floating node; and
an inverter configured to output a digital signal as the second output signal based on the NAND output signal.

18. The ADC of claim 10, wherein the capacitor is configured to accumulate charges when the floating node is floating.

19. A signal processing method of an image sensing device including an analog-to-digital converter (ADC) configured to convert an analog signal input from a plurality of pixels into a digital signal, the signal processing method comprising:
inputting a first signal from the plurality of pixels of the image sensing device to a first input terminal of a first circuit;
inputting a second signal from a ramp signal generator to a second input terminal of the first circuit;
comparing the first signal of the first input terminal with the second signal of the second input terminal and performing a decision operation based on a comparison result;
outputting a first output signal to a select transistor based on a comparison result;
applying a first power supply voltage to the first circuit and a second power supply voltage to the select transistor;
applying a voltage to a floating node through the select transistor based on the first output signal; and
outputting a second output signal from an output circuit by receiving the voltage applied to the floating node during the decision operation,
wherein the outputting of the first output signal includes limiting a bandwidth of the first output signal during the decision operation, and
wherein a level of the first power supply voltage is different from a level of the second power supply voltage.

20. The signal processing method of claim 19, wherein the outputting of the second output signal includes:
producing a Miller effect in the select transistor at a first time point, at which the first circuit generates a decision signal, by flowing a current through the select transistor;
applying a predefined voltage to the floating node at a second time point at which the first circuit completes the decision operation; and cutting off the current flowing into the select transistor at the second time point.

* * * * *